United States Patent [19]

Basi

[11] 3,951,710

[45] Apr. 20, 1976

[54] METHOD FOR REMOVING COPPER CONTAMINANT FROM SEMICONDUCTOR SURFACES

[75] Inventor: Jagtar S. Basi, Fishkill, N.Y.

[73] Assignee: International Business Machines Corporation, Armonk, N.Y.

[22] Filed: Sept. 13, 1974

[21] Appl. No.: 505,699

[52] U.S. Cl.................................. 156/17; 134/2; 134/42; 427/82; 427/309; 427/444; 252/79.1; 252/79.5
[51] Int. Cl.² ....................... B44D 5/12; H01L 7/00
[58] Field of Search .................. 117/213; 134/2, 42; 427/309, 444; 252/79.1, 79.5; 156/17

[56] References Cited
UNITED STATES PATENTS

| | | | |
|---|---|---|---|
| 2,647,830 | 8/1953 | Allen et al. | 75/103 |
| 2,961,354 | 11/1960 | Cleveland | 134/2 |
| 3,413,160 | 11/1968 | Teumac | 148/6.14 |
| 3,436,259 | 4/1969 | Regh | 117/227 |
| 3,447,965 | 6/1969 | Teumac | 134/2 |
| 3,549,433 | 12/1970 | Renner | 134/2 |
| 3,600,244 | 8/1971 | Wegener | 252/79.1 |

FOREIGN PATENTS OR APPLICATIONS

| | | | |
|---|---|---|---|
| 46-6165 | 1971 | Japan | 252/79.1 |

OTHER PUBLICATIONS

Chem. Abstracts, Vol. 79, (Aug. 1973), p. 311, No. 47100d, Copper Ammonia Complex Etching Solution... Alloys.

Primary Examiner—Michael F. Esposito
Attorney, Agent, or Firm—Henry Powers

[57] ABSTRACT

Copper contaminants are removed from silicon with a solution containing copper (II) complexes. The solution may be recycled after use by bubbling oxygen through it.

6 Claims, No Drawings

METHOD FOR REMOVING COPPER CONTAMINANT FROM SEMICONDUCTOR SURFACES

BACKGROUND OF THE INVENTION

1. Field of the Invention

This invention relates to the polishing of a silicon substrate and, more particularly, to the removal of copper from a silicon substrate following chemical-mechanical polishing.

2. Description of the Prior Art

One stage in the manufacture of semiconductor devices commonly consists of polishing silicon wafers. A commonly used polishing process is chemical-mechanical polishing. The chemical-mechanical polishing process has already been described in great detail in U.S. Pat. No. 3,436,259 issued Apr. 1, 1969 to Regh et al. entitled "Method for Plating and Polishing a Silicon Planar Surface" (whose teachings are incorporated herein by reference thereto), having the same assignee as the present invention. This patent is hereby incorporated by reference for the sole purpose of providing a background to those of skill in this art. In the chemical-mechanical polishing process, a silicon substrate is wetted with an excess quantity of a displacement plating solution, while it is continually wiped, using substantial pressure, with a firm surface. The displacement plating solution contains a cupric cation which is plated onto the silicon substrate as copper metal. The simultaneous and continuous wiping of the silicon substrate removes the copper from the silicon surface and produces an extremely flat and well-polished surface on the silicon.

Unfortunately, small amounts of copper remain on the polished silicon substrates. It is necessary to remove this copper because copper atoms in silicon effect the silicon's conductivity and can interfere with the operation of the devices manufactured from the silicon substrate.

One method of removing such copper contaminant had been to rinse the silicon surface with large amounts of high purity nitric acid. While this process is successful in achieving an acceptably low level of copper on the surface, it has a number of serious drawbacks. The use of large quantities of high purity nitric acid is expensive. Because of its corrosive nature using high purity nitric acid can be dangerous and creates a serious disposal problem. Large scale processing is made difficult because the nitric acid tends to corrode almost all of the commercially available automated cleaning equipment. The copper contaminant level on the silicon surface is strongly dependent on the purity of the nitric acid used; thus, only very high purity nitric acid is acceptable for cleaning. Another problem is that the nitric acid oxidizes the surface of silicon and produces a thin oxide film there; this oxide film hinders the removal of copper from the silicon.

SUMMARY OF THE INVENTION

It is therefore an object of this invention to provide a novel method for cheaply and safely removing copper from the surface of silicon.

Another object of the invention is to provide a novel method for removing copper from the surface of silicon which can be employed using simple, inexpensive commercially available equipment without corroding or destroying the equipment.

In accordance with this invention, polished silicon wafers are washed with a cleaning solution containing a copper (II) complex which can be regenerated.

The cleaning solution is produced by first bringing cupric ions into solution by dissolving any cupric salt which can be complexed with ammonia in water. Such copper salts include $CuSO_4$, $Cu(NO_3)_2$, $CuCl_2$ and $Cu(OH)_2$. The stability of cupric ions in aqueous solution depends on the presence of other materials in the solution.

The displacement of the equilibrium to the left can occur when coordinated groups of atoms, such as ammonia (often called ligands), surround a cupric ion to form a copper (II)-ammine complex (cupric tetrammine ion) which has different chemical properties than the bare copper ion. Specifically, the complex formed will be a water soluble cupric tetrammine compound having the cation of the initial copper salt used for example:

a. $Cu(NO_3)_2 + 4NH_3 \rightarrow [Cu(NH_3)_4](NO_3)_2$;
b. $CuCl_2 + 4NH_3 \rightarrow [Cu(NH_3)_4](NO_3)_2$;
c. $CuSO_4 + 4NH_3 \rightarrow [Cu(NH_3)_4]SO_4$; etc.

When ligands are introduced into a solution containing cupric ions, cupric complexes will be formed. If a ligand, such as ammonia, which causes the equilibrium constant K to be less than one is used, the cupric complexes will react with metallic copper, on the silicon wafers, to form cuprous complexes. Since these cuprous complexes are soluble in water, they go readily into solution, with any such solution on wafer removed by rinsing. In this manner, metallic copper may be brought into solution and then removed. The following equations are believed to represent this process:

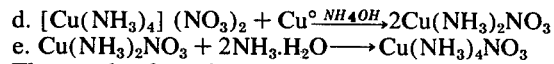

e. $Cu(NH_3)_2NO_3 + 2NH_3.H_2O \longrightarrow Cu(NH_3)_4NO_3$

The supply of cupric complexes in the cleaning solution may be regenerated by bubbling air through the solution. Oxygen in the bubbled air oxidizes the cuprous complexes to cupric complexes as follows:

f. $4Cu(NH_3)_4NO_3 + O_2 + 2H_2O \longrightarrow 4Cu(NH_3)_4NO_3OH$

DESCRIPTION OF THE PREFERRED EMBODIMENT

The cleaning solution typically consists of tetrammine copper (II) ions in aqueous solution. The solution is commonly produced by mixing 100 grams of $Cu(NO_3)_2.3H_2O$ and 600 ml of a 28% by weight solution of $NH_4OH$ in 8350 ml of deionized water. Cupric ions from the dissolved copper nitrate form tetrammine copper (II) ions in the presence of ammonia. Tetrammine copper ions then react with metallic copper, on immersed silicon wafers, as follows: $Cu(NH_3)_4^{+2} + Cu^\circ = 2 Cu(NH_3)_2^{+1}$. The $Cu(NH_3)_2^{+1}$ takes up ammonia to form tetrammine copper (I) ions: $Cu(NH_3)_2^{+1} + 2NH_3 = Cu(NH_3)_4^{+1}$. Tetrammine copper (I) ions are soluble in water and remain in solution. The tetrammine copper (I) ions are oxidized to tetrammine copper (II) ions by bubbling air through the solution. Ammonia lost through evaporation may be replenished as required.

High concentrations of copper (II) complexes although not necessary, are preferred, since cleaning times are reduced as the concentration of copper (II)

complexes in the cleaning solution is increased. The concentration of ligands used in the cleaning solution is preferably greater than the concentration of cupric ions because four ligands are typically required to surround the cupric ion to form the copper (II) complex.

The solution is typically used to clean silicon wafers which have undergone the chemical-mechanical polishing process described in detail by Regh et al. in U.S. Pat. No. 3,436,259. The silicon wafers are rinsed in deionized water following polishing. They are then placed in the cleaning solution of this invention for two minutes. Preferably, the cleaning solution has a pH of at least 10; and the solution is stirred or agitated by other means. The cleaning is ordinarily done at ambient temperature, but it may be carried out at any compatible temperature with corresponding effect on reaction rates. After cleaning, the wafers are merely rinsed (with D.I. water) and dried.

While the invention has been particularly shown and described with reference to the preferred embodiments thereof, it will be understood by those skilled in the art that the foregoing and other changes in form and detail may be made therein without departing from the spirit and scope of the invention.

What is claimed is:

1. A method for removing discrete dispersed traces of copper from a surface of a silicon semiconductor wafer comprising treating said surface with a water solution consisting essentially of a cupric tetrammine compound and ammonium hydroxide at a pH of at least about 10, to react with said copper and generate a spent liquid comprised of a water soluble cuprous diammine compound.

2. A method for removing copper from a surface of a silicon semiconductor wafer comprising treating said surface with a water solution consisting essentially of a cupric tetrammine compound ammonium hydroxide at a pH of at least about 10 to react with said copper and generate a spent liquid comprised of a water soluble cuprous diammine compound including rejuvenating said spent liquid by oxidation of said cuprous diammine compound in an ammonia hydroxide solution.

3. The method of claim 2 wherein said oxidation medium is air.

4. A method of removing copper contaminants from silicon comprising treating said surface with a water solution consisting essentially of a cupric tetrammine compound and ammonium hydroxide at a pH of at least about 10, to react with said copper and generate a spent liquid comprised of a water soluble cuprous diammine compound.

5. The method of claim 4 including rejuvenating said spent liquid by oxidation of said cuprous diammine compound in an ammonia hydroxide solution.

6. The method of claim 5 wherein said oxidation medium is air.

* * * * *